(12) United States Patent
Jain et al.

(10) Patent No.: US 8,558,525 B1
(45) Date of Patent: Oct. 15, 2013

(54) POWER SUPPLY CIRCUIT AND REUSE OF GATE CHARGE

(75) Inventors: Praveen K. Jain, Kingston (CA); Shangzhi Pan, Kingston (CA)

(73) Assignee: International Rectifier Corporation, El Segundo, CA (US)

(*) Notice: Subject to any disclaimer, the term of this patent is extended or adjusted under 35 U.S.C. 154(b) by 1753 days.

(21) Appl. No.: 11/818,910

(22) Filed: Jun. 15, 2007

(51) Int. Cl.
  *G05F 1/24* (2006.01)
  *G05F 1/30* (2006.01)
  *G05F 1/38* (2006.01)

(52) U.S. Cl.
  USPC .............................. 323/282; 323/289; 363/82

(58) Field of Classification Search
  USPC ............ 323/282, 265, 259, 290, 289; 363/81, 363/82, 125–127, 53; 326/82–92; 327/108–112
  See application file for complete search history.

(56) References Cited

U.S. PATENT DOCUMENTS

| | | | | |
|---|---|---|---|---|
| 3,285,173 A * | 11/1966 | Hamilton | ...................... | 102/317 |
| 3,629,725 A * | 12/1971 | Chun | ........................ | 331/113 A |
| 4,638,420 A * | 1/1987 | Forge | ............................. | 363/132 |
| 5,336,985 A * | 8/1994 | McKenzie | ..................... | 323/266 |
| 5,514,921 A * | 5/1996 | Steigerwald | .................. | 307/125 |
| 6,188,209 B1 * | 2/2001 | Poon et al. | ..................... | 323/255 |
| 6,262,564 B1 * | 7/2001 | Kanamori | ...................... | 323/224 |
| 6,285,173 B1 * | 9/2001 | Bentolila et al. | .............. | 323/282 |
| 6,583,610 B2 * | 6/2003 | Groom et al. | ................. | 323/288 |
| 6,650,558 B1 * | 11/2003 | Pacala et al. | .................. | 363/132 |
| 2006/0119326 A1 * | 6/2006 | Jiang | .............................. | 323/222 |
| 2006/0186922 A1 * | 8/2006 | Rozsypal | ........................ | 326/63 |
| 2006/0250207 A1 * | 11/2006 | Shudarek | ...................... | 336/212 |

* cited by examiner

*Primary Examiner* — Adolf Berhane
*Assistant Examiner* — Nusrat Quddus
(74) *Attorney, Agent, or Firm* — Chapin IP Law, LLC

(57) ABSTRACT

To reduce gate-drive losses caused by high switching frequency operation, embodiments herein include a novel resonant gate driver circuit for driving switches. This gate drive circuit can include a simple two-half-bridge structure. A coupling inductor of the resonant gate driver circuit can provide energy circulation between gates of high and low side switches and also works as a voltage-boost transformer. According to one configuration, the resonant gate driver circuit can be extended to drive two MOSFETs with a common ground. Both theoretical and simulation results for the new resonant gate driver circuit illustrate increased efficiency via lower switching losses.

27 Claims, 9 Drawing Sheets

POWER SUPPLY CIRCUIT AND REUSE OF GATE CHARGE

BACKGROUND

A voltage regulator module (e.g., a VRM) can be used to regulate a DC voltage supplied to a load, such as a microprocessor. A VRM can include a power converter, such as a DC-DC converter, and may include other components such as a controller for controlling operation of the power converter.

An example of a DC-DC converter is a synchronous buck converter, which has minimal components, and therefore is widely used in VRM applications. In an example application, the input voltage to the buck converter is typically $12V_{DC}$. An output voltage produced by the VRM may be $5.0V_{DC}$, 3.3 $V_{DC}$, or lower.

Multiphase interleaved VRM topologies include two or more power converters operated in parallel with each other to convert power and apply it to a corresponding load. In each of the power converters (or each power converter phase), the filter inductor can be smaller than that of a single phase power converter in order to achieve a faster dynamic response. The large output voltage ripple in each phase due to the small inductance can be cancelled by the ripple of other phases. Use of more phases in parallel reduces the ripple voltage. Implementation of a multiphase voltage converter topology (as compared to a single voltage converter phase topology) can therefore enhance the output current capability of a power supply system.

A typical configuration of a VRM such as a so-called synchronous buck converter includes an inductor, a high side switch, and a low side switch. A controller associated with the buck converter repeatedly pulses the high side switch ON to convey power from a power source through the inductor to a dynamic load. The controller repeatedly pulses the low side switch ON to provide a low impedance path from a node of the inductor to ground in order to control an output of the buck converter. Thus, the energy stored in the inductor increases during a time when the high side switch is ON and decreases during a time when the low side switch is ON. During switching operation, the inductor transfers energy from the input to the output of the converter.

SUMMARY

Conventional voltage converter circuits as discussed above suffer from a number of deficiencies. For example, conventional synchronous buck converters typically dissipate a portion of energy received from a respective power source in lieu of conveying all of the energy received from a respective power source to a corresponding load. This wasted energy precipitates out of the buck converter circuit as unwanted heat, which (if too high) can increase the likelihood of damage to the buck converter or other nearby electronic components. These losses (e.g., dissipation of unwanted heat) increase an amount of power that must be provided to merely operate buck converter. In certain cases, inefficiencies in the buck converter can require that the power supply be oversized to account for losses in the buck converter and increases the cost of energy.

Switching frequencies associated with switching circuits such as those implemented in power converters are being pushed into the Mega-Hertz range to provide small component size and fast transient response. However, an issue related to high frequency applications is the significant gate driving losses, especially in high-current switching applications requiring larger switch die sizes such as those found in MOSFET devices. At higher switching frequencies, the increased gate-drive losses can be so large as to offset the advantages gained by the lower conduction losses associated with large die sized MOSFETs used for switching.

For a conventional gate drive circuit, gate drive losses include the capacitive power losses Pcap related to a main power MOSFET (M) gate charge, the switching losses Psw_sm, and driving losses Pdr_sm of a small driving MOSFETs (M1 & M2). Such losses can be quantified as follows:

$$P_{CAP} = Qg \times Vg \times Fsw$$

$$Psw\_sm = 2 \times Coss\_sm \times Vg \times Fsw$$

$$Pdr\_sm = 2 \times Qg\_sm \times Vdr \times Fsw$$

Where, Qg is the total charge of the main power MOSFET when the gate is charged to voltage level Vg, and Fsw is the switching frequency. Coss_sm is the equivalent output capacitance, and Qg_sm is the total charge when the gate is charged to voltage level Vdr of a respective driving MOSFET that drives the gate resistor of the switching MOSFET.

In order to reduce the gate driving losses, one or more of the three power losses mentioned above should be reduced or eliminated.

Conventional resonant gate driver methods present an alternative to the conventional gate driver to reduce such losses as mentioned above. In the past, many conventional resonant gate drive techniques have been developed to reduce these driving losses. However, such conventional drive circuits are only suitable for use with a single switch. For example, according to conventional techniques, to drive both a top switch and bottom switch (e.g., a high side switch and low side switch) in a circuit such as a synchronous buck converter, two independent sets of drive circuits and corresponding two different sets of magnetic components are needed. The size of such conventional resonant gate drive circuits can be relatively large and thus prohibitive in certain applications.

Techniques discussed herein deviate with respect to conventional applications such as those discussed above as well as other techniques known in the prior art. For example, certain embodiments herein are directed to improving the efficiency of switching power supply circuits. For example, to reduce gate driving losses caused by high frequency switching operation, embodiments herein include a novel switch driver circuit.

More specifically, a switch driver circuit according to embodiments herein can include a first driver circuit to control switching of a first switch device, a second driver circuit to control switching of a second switch device, and an intermediary circuit (e.g., bridge circuit) between the first driver circuit and the second driver circuit. The intermediary circuit can be configured to transfer gate energy between the first switch driver circuit and the second switch driver circuit. Assume that the energy or charge is initially used to activate the first switch device. The intermediary circuit initiates a transfer of the energy or charge to the second switch device. Transferring the gate energy causes activation of the second switch and deactivation of the first switch device. In a following cycle, the intermediary circuit supports a transfer of the energy or charge back to the first switch driver circuit, resulting in deactivation of the second switch device and activation of the first switch device. Reuse of the switch activation energy between switches reduces overall losses as the switches are activated and deactivated over time.

In addition to the apparatus (e.g., bridge circuitry) as discussed above, embodiments herein include a method of controlling switching of a first switch device and controlling switching of a second switch device. Such a process can include activating the first switch device by applying energy to a respective gate of the first switch device and, thereafter, activating the second switch by initiating a transfer of the applied energy from the respective gate of the first switch device to a respective gate of the second switch device.

In further embodiments, the bridge circuit or intermediary circuit enables a transfer of the switch activation energy from the respective gate of a first switch device to a respective gate of a second switch device. The transfer of the switch activation energy from the respective gate of the first switch device to the second switch device results in deactivation (e.g., turn OFF) of the first switch device as mentioned above as well as activation (e.g., turn ON) of the second switch device. Transfer of the switch activation energy from the respective gate of the second switch device to the first switch device results in deactivation (e.g., turn OFF) of the second switch device as well as activation (e.g., turn ON) of the first switch device, and so on.

In yet more specific embodiments, the novel gate drive circuit as described herein can include a simple two-half-bridge structure. An energy storage device such as an inductor and/or capacitor couples the first drive circuit and the second drive circuit and provides a bridge for energy re-circulation between gates of high and low side switches.

The bridge can potentially operate as a voltage-boost transformer.

According to further configurations, the gate driver circuit as described herein can be extended to drive two field effect transistor devices (e.g., MOSFETs) having a common ground.

Both theoretical and simulation results indicate that the gate driver circuit as described herein provides benefits over conventional methods. For example, the novel gate driver circuit as described herein increases efficiency via lower switching losses. In other words, switch activation energy is reused to reduce power losses. Reducing losses via reuse translates into lower dissipated heat. Dissipation of less heat relaxes the need for a heat dissipation mechanism (which may be expensive and cumbersome to implement) in the corresponding switching circuit. In addition to reduced heat, the driver circuit as described herein can be implemented in a smaller form factor than conventional circuits.

As discussed above, techniques herein are well suited for use in switching power supply circuitry. However, it should be noted that embodiments herein are not limited to use in such applications and that the techniques discussed herein are well suited for other applications as well.

Note also that each of the different features, techniques, configurations, etc. discussed herein can be executed independently or in combination with any or all other features also described herein. Accordingly, the present invention can be embodied, viewed, and claimed in many different ways.

This summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives (permutations) of the invention, the reader is directed to the Detailed Description section and corresponding figures of the present disclosure as further discussed below.

BRIEF DESCRIPTION OF THE DRAWINGS

The foregoing and other objects, features, and advantages of the invention will be apparent from the following more particular description of preferred embodiments herein, as illustrated in the accompanying drawings in which like reference characters refer to the same parts throughout the different views. The drawings are not necessarily to scale, with emphasis instead being placed upon illustrating the embodiments, principles and concepts.

DETAILED DESCRIPTION

Embodiments herein include a bridge circuit to reduce gate driving losses caused by high frequency switching operation. For example, a switch control circuit can include a bridge circuit to transfer switch activation energy (e.g., charge, current, energy, voltage, etc.) between a first drive circuit and a second drive circuit. The bridge circuit reduces losses based on reuse of the switch activation energy. In other words, switch activation energy can be used to activate a first switch device for a first duration while a second switch device is deactivated. Via the bridge circuit, the switch activation energy can be transferred from the first switch device to the second switch device to deactivate the first switch device and activate the second switch device. This process can be repeated to turn the first and second switch device ON and OFF over time.

Figure 1:
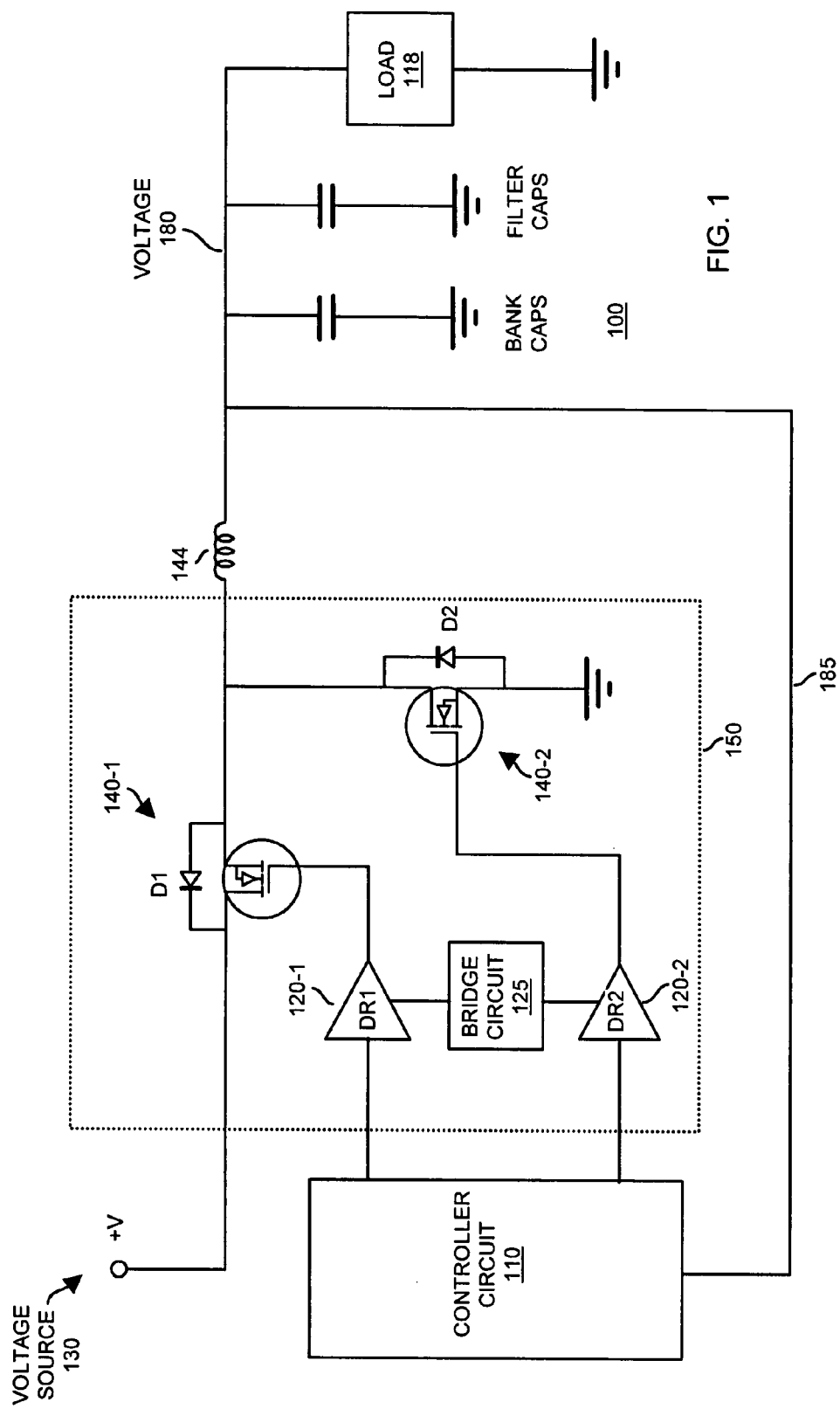
FIG. 1 is an example diagram of a switch driver circuit in the context of a switching power supply according to embodiments herein.

FIG. 1 is a diagram illustrating an example switch driver circuit 150 in the context of a switching power supply circuit 100 according to embodiments herein. Although the switch driver circuit 150 is shown in the context of a switching power supply circuit 100 (e.g., a DC-DC power converter), note that the switch driver circuit 150 and/or corresponding bridge circuit 125 can be used in other suitable applications in which it is useful to transfer, relay, etc. switch activation energy amongst multiple switch devices that turn on at different times.

As shown, switch driver circuit 150 includes switch element 140-1 (e.g., a high side switch device) and switch element 140-2 (e.g., a low side switch device). Switch driver circuit 120-1 controls operation of switch element 140-1 while switch driver circuit 120-2 controls operation of switch element 140-2. Thus, one embodiment herein includes switch driver circuit 120-1 configured to control an ON/OFF state of switch device 140-1 and second switch driver circuit 120-2 configured to control an ON/OFF state of switch device 140-2.

In the context of the present example, the switch driver circuits 120 (e.g., switch driver circuit 120-1 and switch driver circuit 120-2) operate in such a way that both switch elements 140 are not fully activated at the same time. That is, when the switch element 140-1 is activated, switch element 140-2 is deactivated. When the switch element 140-2 is activated, switch element 140-1 is deactivated.

General operation of switch driver circuit 150 includes providing input control signals from a source such as controller 110 to switch driver circuit 120-1 and switch driver circuit 120-2.

As mentioned above, the switch driver circuits 120 apply switch activation energy (e.g., charge) to the switch elements 140 to turn them to an ON state (e.g., conductive state). Bridge circuit 125 supports reuse of switch activation energy to activate the switches.

For example, switch driver circuit 120-1 initiates activation of switch element 140-1 by driving switch element 140-1 with switch activation energy (e.g., gate current to charge a corresponding gate of a field effect transistor). Switch driver circuit 120-1 eventually deactivates the switch element 140-1 by removing the switch activation energy. Bridge circuit 125 transfers the switch activation energy (previously used to activate switch element 140-1) from switch driver circuit 120-1 and respective switch element 140-1 to switch driver circuit 120-2 and switch element 140-2. Application of switch activation energy or charge to a respective gate of switch element 140-2 via switch driver circuit 120-2 causes switch element 140-2 to turn ON.

Reuse of switch activation energy in this way to activate different switch devices (e.g., switch elements 140) over time reduces an amount of power losses associated with power supply circuit 100.

During operation, power supply circuit 100 supports conversion of a DC voltage to another DC voltage. For example, as shown, power supply system 100 includes a voltage source 130 (e.g., +12 VDC), a controller 110, drive circuit DR1 and drive circuit DR2, high side switch device 142, low side switch device 146, element 144 (e.g., an energy storage device such as an inductor, filter, etc.), and dynamic load 118.

A combination of the components shown in power supply system 100 (e.g., a single phase synchronous buck converter) comprises a switching power supply system that produces a substantially constant voltage 180 for driving dynamic load 118.

Controller circuit 110 originates control signals (e.g., logic signals) to initiate opening and closing of switch elements 140 at appropriate times such that voltage 180 is maintained within a specified range such as 1.5+/−0.05 VDC.

For example, in one embodiment, controller circuit 110 utilizes feedback signal (e.g., the voltage provided to dynamic load 118) on which to base opening and closing of a respective high side switch device (e.g., switch element 140-1) and respective low side switch device (e.g., switch element 140-2). When feedback signal 185 is below the specified range or a respective chosen threshold value, controller 110 initiates activation of switch element 140-1 and deactivation of switch element 140-2. When feedback signal 185 indicates that the voltage 180 is above the specified range or greater than a respective threshold value, controller 110 initiates deactivation of switch element 140-1 and activation of switch element 140-2. Thus, controller 110 can be configured to control the transfer of the switch activation energy between multiple switch devices 140 by circulating at least a portion of electrical charge between a respective gate of switch device 140-1 and a respective gate of switch device 140-2.

Of course, some of the energy used to activate switch elements 140 can be lost as heat during a respective transfer due to resistance associated with the switch driver circuit 150 and/or bridge circuit 125. However, bridge circuit 125 can enable reuse of a majority of switch energy used to activate the switches from one cycle to the next. The switch driver circuit 120 and/or bridge circuit 125 can be configured to replenish any lost charge so that switch element 140 can be appropriately turned on and off.

Figure 2:
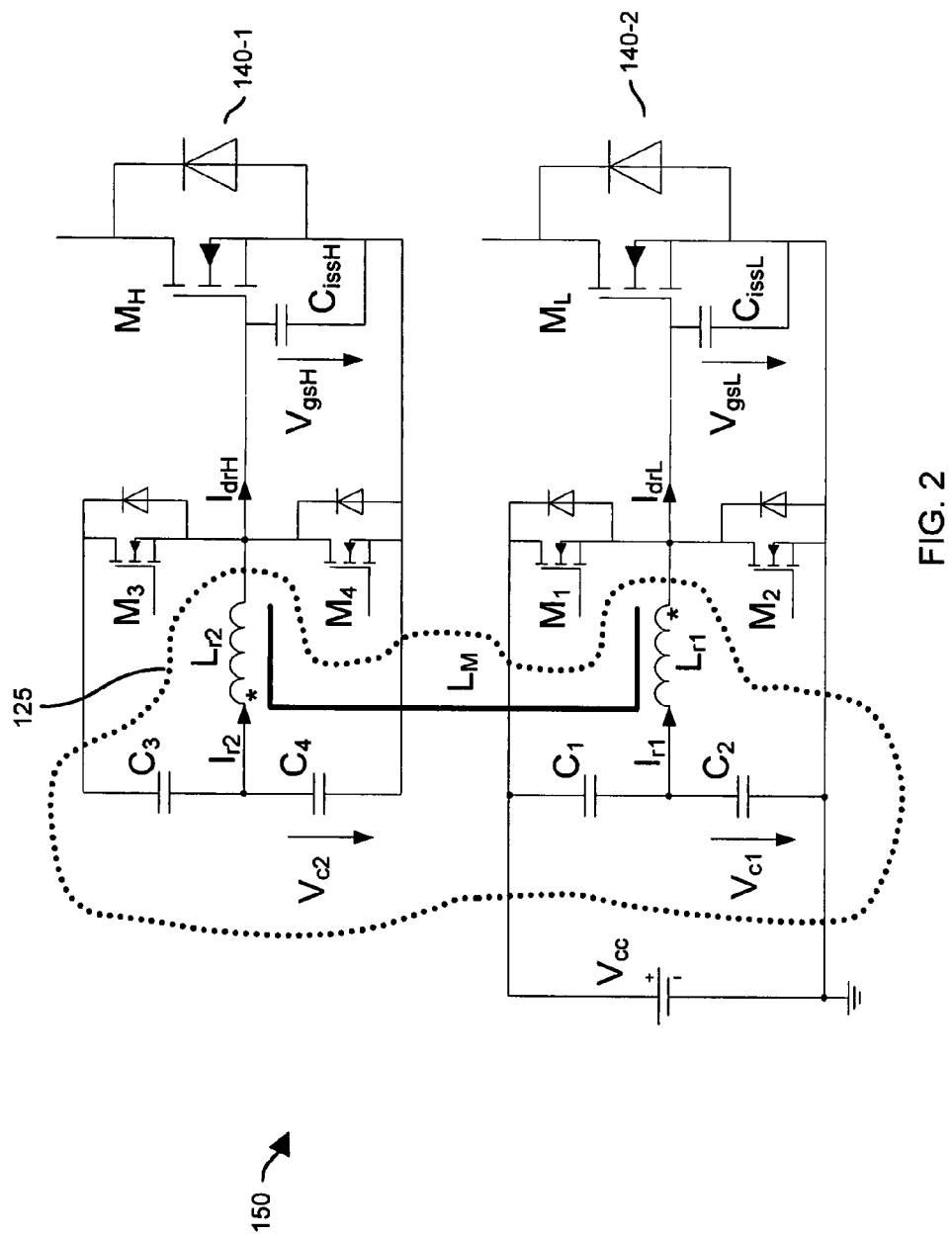
FIG. 2 is an example diagram illustrating a switch driver circuit including a bridge circuit according to embodiments herein.

FIG. 2 is an example diagram of switch driver circuit 150 according to embodiments herein. As shown, switch driver circuit includes switch element 140-1 (also labeled $M_H$), switch element 140-2 (also labeled $M_L$), switch M1, switch M2, switch M3, switch M4, and bridge circuit 125. Controller 110 drives each of switches M1, M2, M3, and M4 to control activation and deactivation of switch elements 140. As previously discussed, bridge circuit 125 enables reuse of gate activation energy to reduce switching losses.

In the context of the present example, bridge circuit 125 in FIG. 2 includes two half-bridge circuits (e.g., inductor Lr1 and inductor Lr2). Each half of such a bridge circuit 125 couples to a corresponding switch element 140. Thus, bridge circuit 125 couples a respective gate of switch device 140-1 to a respective gate of switch device 140-2 enabling the transfer of the switch activation energy (e.g., charge or other mechanism in which to activate switches) between switch devices 140. In this example embodiment shown, bridge circuit 125 also includes four capacitors (C1, C2, C3, and C4).

In one embodiment, the two resonant inductors Lr1 and Lr2 are coupled to each other via a common magnetic core. Voltage source Vcc provides power to switch driver circuit 150 and bridge circuit 125 and replenishes gate activation energy as necessary as a result of losses.

Note that during operation, coupling inductors Lr1 and Lr2 can operate as a voltage boost transformer.

According to one embodiment, the driving MOSFET pairs (e.g., switches M1, M2, M3, and M4) work in the complementary control mode respectively. The controller 110 can incorporate a dead time in respective one or more transitions (on→off, off→on) to prevent cross-conduction. In other words, the switch driver circuit is operated such that there is at least a small delay between activating switch element 140-1 and activating switch element 140-2.

Figure 3:
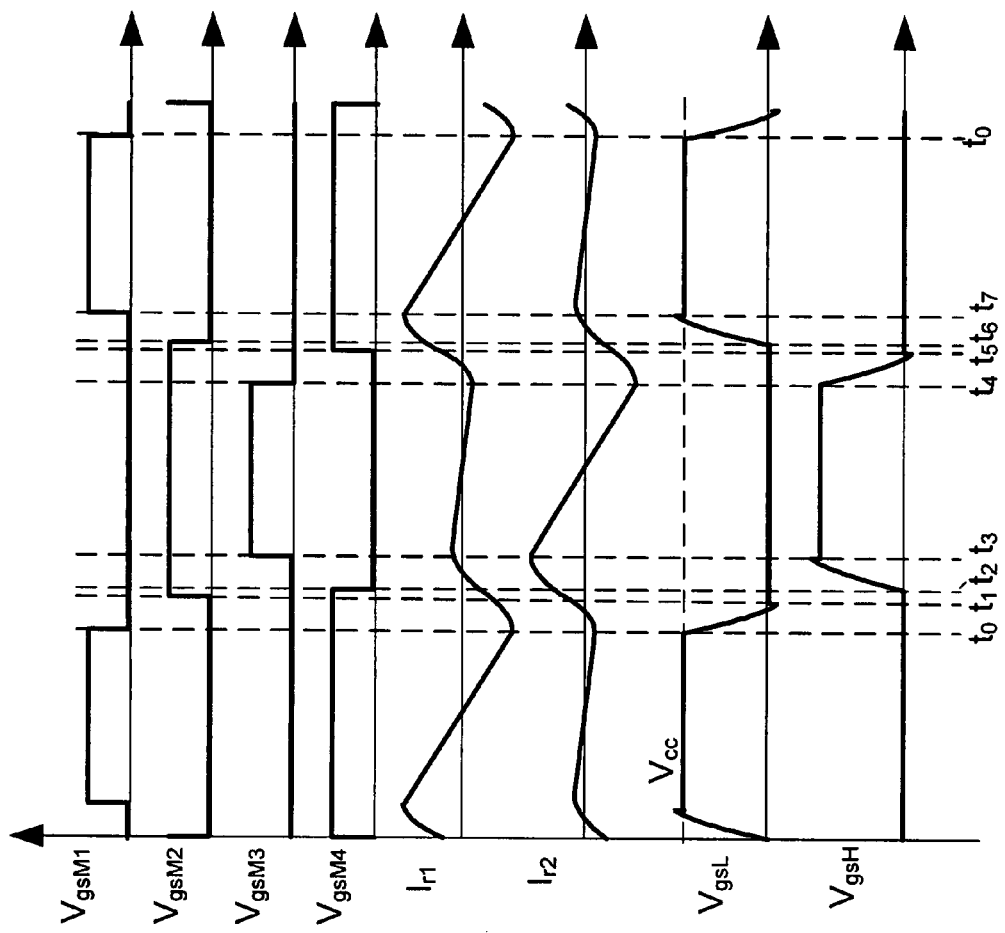
FIG. 3 is an example diagram illustrating timing information associated with operations of a switch driver circuit according to embodiments herein.

FIG. 3 is an example diagram illustrating timing information associated with switch driver circuit 150 according to embodiments herein. The principle operation of switch driver circuit 150 (in FIG. 2) is discussed below. Controller 110 produces and drives switch driver circuit 150 with signal VgsM1 (e.g., the gate voltage of switch element 140-1), signal VgsM1 (e.g., the gate voltage of switch element M1), signal VgsM2 (e.g., the gate voltage of switch element M2), signal VgsM3 (e.g., the gate voltage of switch element M3), and signal VgsM4 (e.g., the gate voltage of switch element M4). Ir1 represents current through inductor Lr1. Ir2 represents current through inductor Lr2. VgsL is a gate voltage of switch element 140-2 (e.g., switch element ML). VgsH is a gate voltage of switch element 140-1 (e.g., switch element MH). As mentioned above, inductor Lr1 and inductor Lr2 of bridge circuit 125 can have a common magnetic core.

1). Turning Off Switch ML (e.g., Switch Element 140-2)

At t0 of FIG. 3, controller 110 switches M1 off to induce the resonant action to turn off the bottom switch ML (e.g., switch element 140-2). Energy (e.g., gate activation energy) stored in the input gate capacitor CissL (e.g., inherent gate capacitance of gate $M_L$) and the inductor Lr1 is recovered through the inductor Lr2 and the input capacitor. Before t1, the voltage VgsL on the gate capacitor CissL is decreased to zero and is clamped to zero by the body diode (e.g., inherent diode) of switch M2. At t1, the controller 110 turns on switch M2 under Zero Voltage Switching (ZVS) condition, and the gate voltage VgsL is clamped to zero and provides low impedance. The interval (t2-t1) is the dead time between gate signals VgsL and VgsH.

2). Turning on Switch MH (e.g., Switch Element 140-1)

At t2, the controller 110 turns off switch M4, inducing the resonant action to turn on the top switch MH (e.g., switch element 140-1). Energy is transferred from the large capacitor C3 to the input gate capacitor CissH. Before t3, the voltage VgsH on the gate capacitor CissH is increased to Vcb, which is the voltage across the capacitors C3 and C4 and normally equals the source voltage Vcc, and is clamped to Vcb by the body diode of switch M3. At t3, the controller 110 turns on switch M3 under ZVS condition, and the gate voltage VgsH is clamped to Vcb; switch element 140-1 thus provides low impedance because it is turned on. Typical values for CissH, CissL can be in the order of 1-10 nF. An example value for the resonant inductors (Lr1 and Lr2) are 1 uH and the coupling inductor LM can be 0.9 uH. Example values for input capacitors C1 through C4 are in the order of few uF. Of course, these are only a few examples of the typical and any value capacitors and inductors can be used in the circuit.

3). Turning Off the Switch MH (e.g., Switch Element 140-1)

At t4, the controller 110 turns off switch M3, inducing the resonant action to turn off the top switch MH. Energy in the input gate capacitor CissH and the inductor Lr2 is recovered through the inductor Lr1 and the input capacitor. Before t5, the voltage VgsH on the gate capacitor CissH decreases to zero and is clamped to zero by the body diode of switch M4. At t5, controller 110 turns on switch M4 under ZVS condition, and the gate voltage VgsH is clamped to zero and provides low impedance. The interval (t6-t5) represents the dead time between gate signals VgsL and VgsH.

4). Turning On the Switch ML (e.g., Switch Element 140-2)

At t6, the controller 110 turns off switch M2, inducing the resonant action to turn on the bottom switch ML. Energy is transferred from the large capacitor to the input gate capacitor CissL. Before t7, the voltage VgsL on the gate capacitor CissL increases to the source voltage Vcc, and is clamped to Vcc by the body diode of switch M1. At t7, the controller 110 turns on switch M1 under ZVS condition, and the gate voltage VgsL is clamped to Vcc.

Via bridge circuit 125 (e.g., a resonance circuit supporting switching as described herein), energy (i.e., switch activation energy) is recovered during both charging and discharging transitions. Such energy circulates between the top driving circuit (e.g., the circuit driving switch element 140-1) and the bottom driving circuit (e.g., the circuit driving the switch element 140-2). Under steady state conditions, the boosted voltage Vcb is around Vcc. For example, Vcb is a little higher in value than Vcc for smaller duty cycles and a little lower than Vcc at larger duty cycles.

Figure 4:
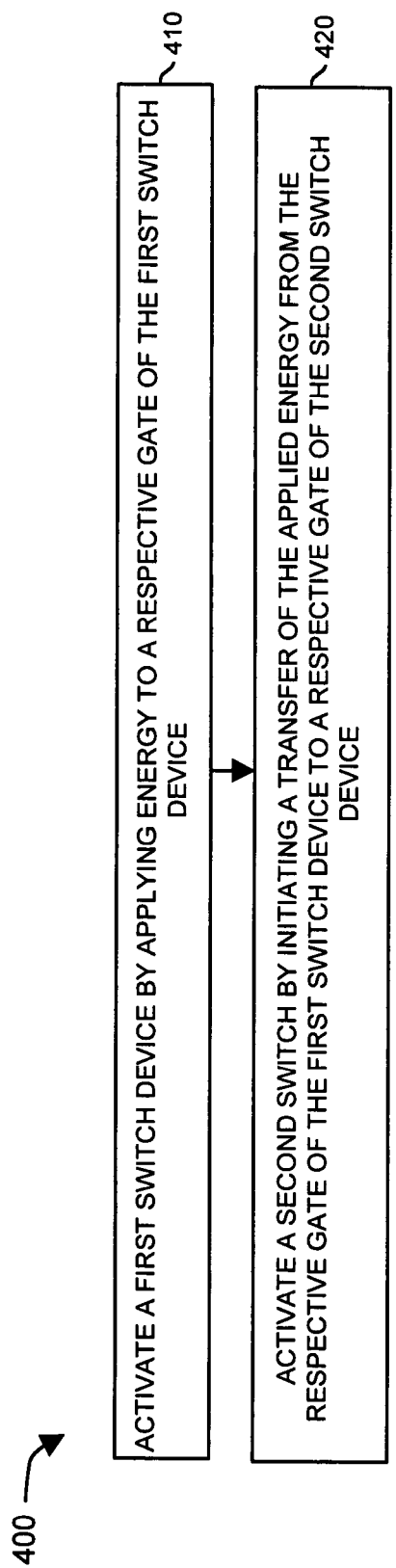
FIG. 4 is a flowchart illustrating an example of a method for implementing reuse of switch activation energy or charge according to embodiments herein.

FIG. 4 is an example flowchart 400 illustrating a technique of supplying power according to embodiments herein.

In step 410, the controller 110 activates switch element 140-1 by applying energy to a respective gate of switch element 140-1.

In step 420, the controller 110 activates switch element 140-2 by initiating a transfer of the applied energy from the respective gate of switch element 140-1 to a respective gate of switch element 140-2.

Figure 5A:
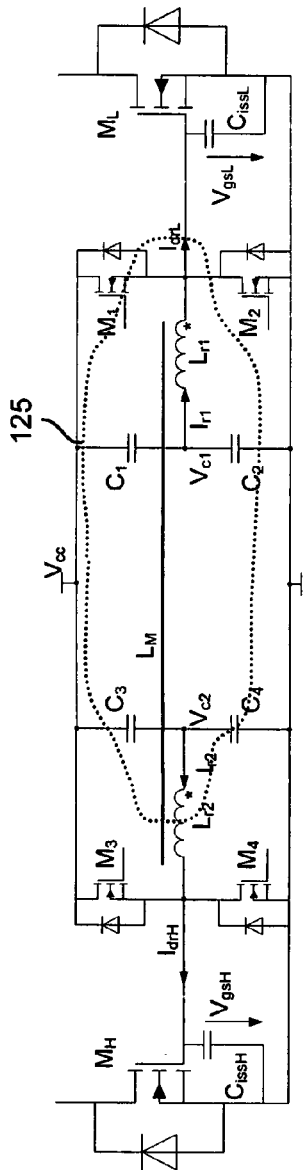
FIGS. 5A, 5B, 5C, and 5D are example diagrams of different switch driver circuits and corresponding bridge circuits according to embodiments herein.

Note that controller 110 can also be used to drive two MOSFETs (e.g., a resonant gate driver circuit including a set of synchronous rectifying MOSFETs) having a common ground as shown in the example embodiment of FIG. 5A. Implementing the switch driver circuit 150 to have a common ground as in FIG. 5A simplifies the driving circuit. According to such an implementation, the two half-bridge type driving circuits operate in parallel relative to a common ground reference.

Under different duty cycles, a voltage difference can develop between Vc1 and Vc2. So a relatively large capacitor Cb (as specified in FIG. 5B) can be added between the two gate driving circuits to balance the voltage difference. Accordingly, embodiments herein include a bridge circuit 125 including a capacitor (e.g., Cb) coupling the multiple inductors Lr1 and Lr2.

Figure 5B:
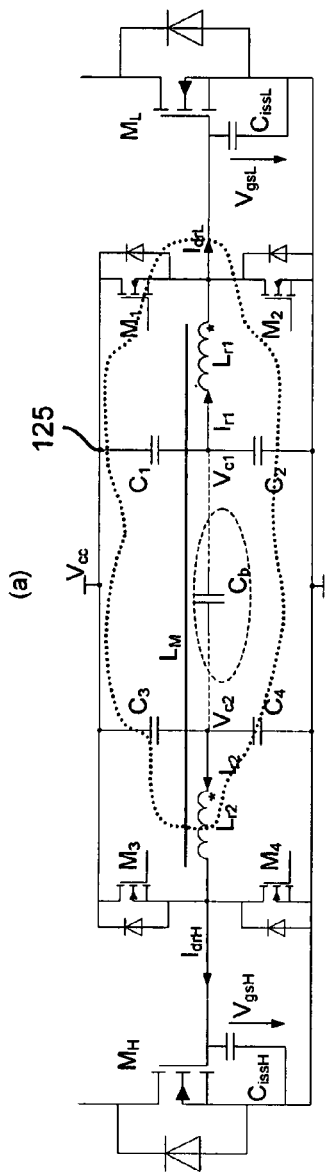
Figure 5C:
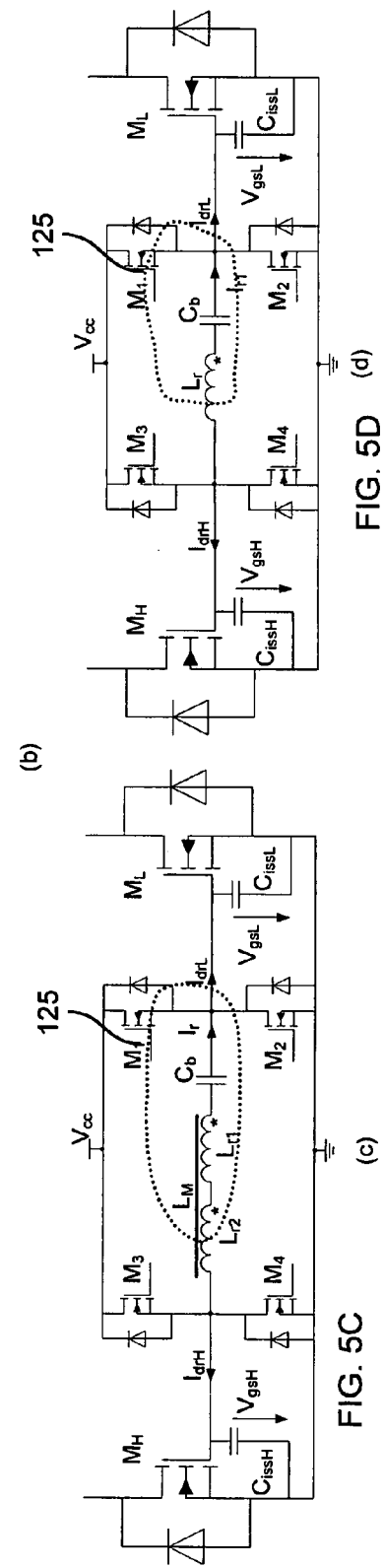

As shown in FIG. 5C, capacitors (C1, C2, C3, and C4) can be eliminated from circuit 150.

Figure 5D:
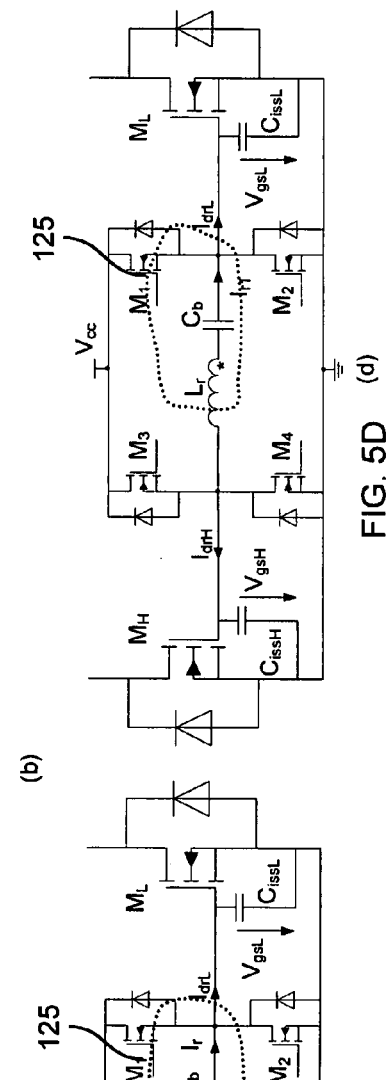

In FIG. 5D, the inductors Lr1 and Lr2 are replaced with a single inductor Lr. The capacitors C1, C2, C3, and C4 are replaced with a single capacitor Cb.

Accordingly, as shown in FIGS. 5A, 5B, 5C, and 5D, bridge circuit 125 can be implemented in a number of different ways.

The example timing diagram as illustrated in FIG. 3 can be used to operate the circuits in FIGS. 5A, 5B, and 5C.

Figure 6:
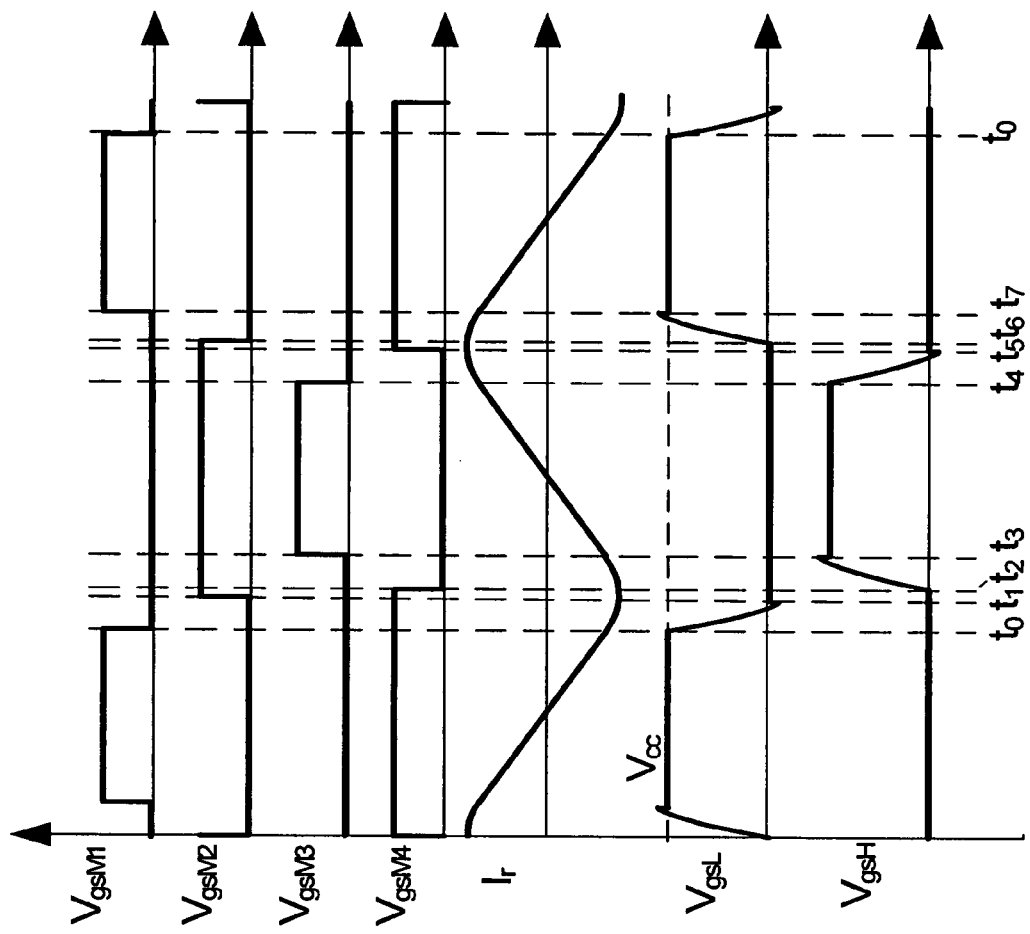
FIG. 6 is an example diagram illustrating timing information associated with operations of a switch driver circuit according to embodiments herein.

The example timing diagram as illustrated in FIG. 6 can be used to operate the switch driver circuit FIG. 5D. As shown, the bridge circuit 125 in FIG. 5D includes an inductor Lr in series with capacitor Cb. A combination of the inductor and capacitor couples a respective gate of switch device Mh to a respective gate of switch device M1.

Note that both of the switch driver circuits (e.g., gate drivers circuits in FIG. 5A and FIG. 5D) can be utilized for driving synchronous rectifier MOSFETs in asymmetrical and symmetrical power circuits.

Loss Analysis

Ideally, the switch driver circuit 150 (e.g., resonant gate switch driver circuit) as discussed herein is lossless. However, as mentioned above, there is always some resistance in charging and discharging paths resulting in heat loss. Note that there is also energy loss in the on-state resistor Rds of driving MOSFETs (e.g., switch elements 140) and the gate resistor Rg (inherent or extra discrete gate resistor in series with the gate) of the power FETs. However, this loss can be minimal compared to the energy savings as a result of reusing switch activation energy.

Figure 7:
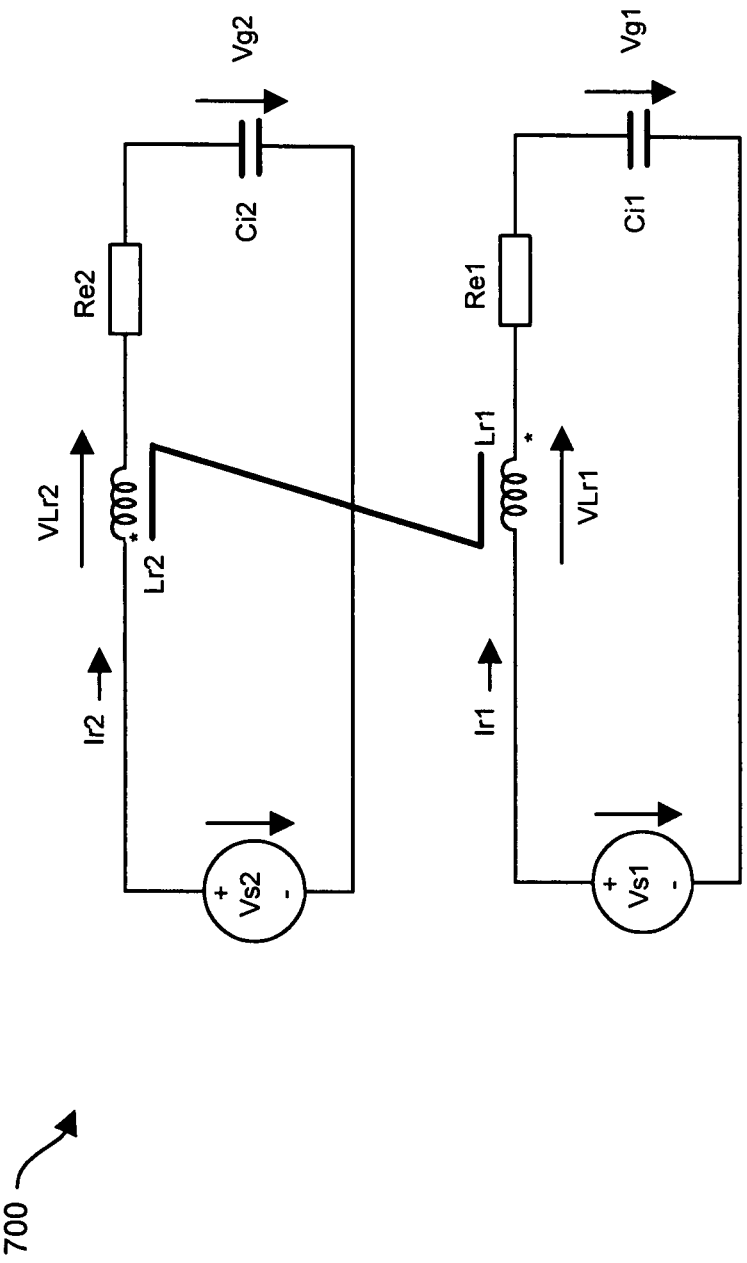
FIG. 7 is an example diagram of a switch driver circuit according to embodiments herein.

During the turning-on or turning-off transition, the equivalent circuit associated with switch driver circuit 150 can be summarized as specified in circuit 700 of FIG. 7. Re1 and Re2 represent the sum of all resistances in each respective path. Vs1 and Vs2 represent the equivalent voltage sources in each path. Lr1 and Lr2 are the resonant inductors. Ci1 and Ci2 are the equivalent input gate capacitance of the respective switch elements 140 (e.g., power MOSFETs) during turning-on/off transitions. During the steady-state, Ci1 and Ci2 are treated as infinite-value capacitors.

The fourth-order mathematical model shown in FIG. 7 can be expressed as:

$$\frac{d}{dt}\begin{bmatrix} i_{r1} \\ i_{r2} \\ v_{g1} \\ v_{g2} \end{bmatrix} = \begin{bmatrix} -k_2 R_{e1} & -k_3 R_{e2} & -k_2 & -k_3 \\ -k_3 R_{e1} & -k_1 R_{e2} & -k_3 & -k_1 \\ m_1 & 0 & 0 & 0 \\ 0 & m_2 & 0 & 0 \end{bmatrix} \begin{bmatrix} i_{r1} \\ i_{r2} \\ v_{g1} \\ v_{g2} \end{bmatrix} + \begin{bmatrix} k_2 & k_3 \\ k_3 & k_1 \\ 0 & 0 \\ 0 & 0 \end{bmatrix} \begin{bmatrix} V_{s1} \\ V_{s2} \end{bmatrix}$$

Where $$k_1 = \frac{L_{r1}}{L_{r1} L_{r2} - L_M^2}$$

-continued $$k_2 = \frac{L_{r2}}{L_{r1}L_{r2} - L_M^2}$$

$$k_3 = \frac{L_M}{L_{r1}L_{r2} - L_M^2}$$

$$m_1 = \frac{1}{C_{i1}}$$

$$m_2 = \frac{1}{C_{i2}}$$

During different time intervals, this four-order mathematical model may be reduced to a three-order or two-order mathematical model. For example, during turning-on of bottom switch, Ci2 is treated as an infinite-value capacitor and vg2 equals zero, so it will be a three-order system. If there is no turning-on/off transition (steady-state), both Ci1 and Ci2 are treated as infinite-value capacitors, and both vg1 and vg2 equal zero, so it will be reduced to be a two-order mathematical model.

Table I below lists different parameters for different intervals for solving differential equations.

TABLE 1

|  | $M_L$ turning off ($t_1$-$t_0$) | Dead time ($t_2$-$t_1$) | $M_H$ turning on ($t_3$-$t_2$) | $M_H$ ON state ($t_4$-$t_3$) | $M_H$ turning off $t_5$-$t_4$) | Dead time ($t_6$-$t_5$) | $M_L$ turning on ($t_7$-$t_6$) | $M_L$ ON state ($t_0$-$t_7$) |
|---|---|---|---|---|---|---|---|---|
| System Order | 3 | 2 | 3 | 2 | 3 | 2 | 3 | 2 |
| $V_{s1}$ | $V_{c1}$ | $V_{c1}$ | $V_{c1}$ | $V_{c1}$ | $V_{c1}$ | $V_{c1}$ | $V_{c1}$ | $V_{c1}$-$V_{cc}$ |
| $V_{s2}$ | $V_{c2}$ | $V_{c2}$ | $V_{c2}$ | $V_{c2}$-$V_{cc}$ | $V_{c2}$ | $V_{c2}$ | $V_{c2}$ | $V_{c2}$ |
| $R_{e1}$ | $R_g$ | $R_{ds}$ | $R_{ds}$ | $R_{ds}$ | $R_d$ | $R_{ds}$ | $R_g$ | $R_{ds}$ |
| $R_{e2}$ | $R_{ds}$ | $R_{ds}$ | $R_g$ | $R_{ds}$ | $R_{ds}$ | $R_{ds}$ | $R_{ds}$ | $R_{ds}$ |
| $C_{i1}$ | $C_{issL}$ | Inf. | Inf. | Inf. | Inf. | Inf. | $C_{issL}$ | Inf. |
| $C_{i2}$ | Inf. | Inf. | $C_{issH}$ | Inf. | $C_{issH}$ | Inf. | Inf. | Inf. |
| $v_{g1}$ | $v_{g1}$ | 0 | 0 | 0 | 0 | 0 | $v_{g1}$ | 0 |
| $v_{g2}$ | 0 | 0 | $v_{g2}$ | 0 | $v_{g2}$ | 0 | 0 | 0 |
| $V_{gs0}$ | $V_{cc}$ | 0 | 0 | 0 | $V_{cc}$ | 0 | 0 | 0 |

So, the resistive power loss can be estimated as:

$$p_r(t) = \frac{R_{e1}}{T_s}\int_0^{T_s} i_{r1}^2(t)\cdot dt + \frac{R_{e2}}{T_s}\int_0^{T_s} i_{r2}^2(t)\cdot dt$$

Figure 8:
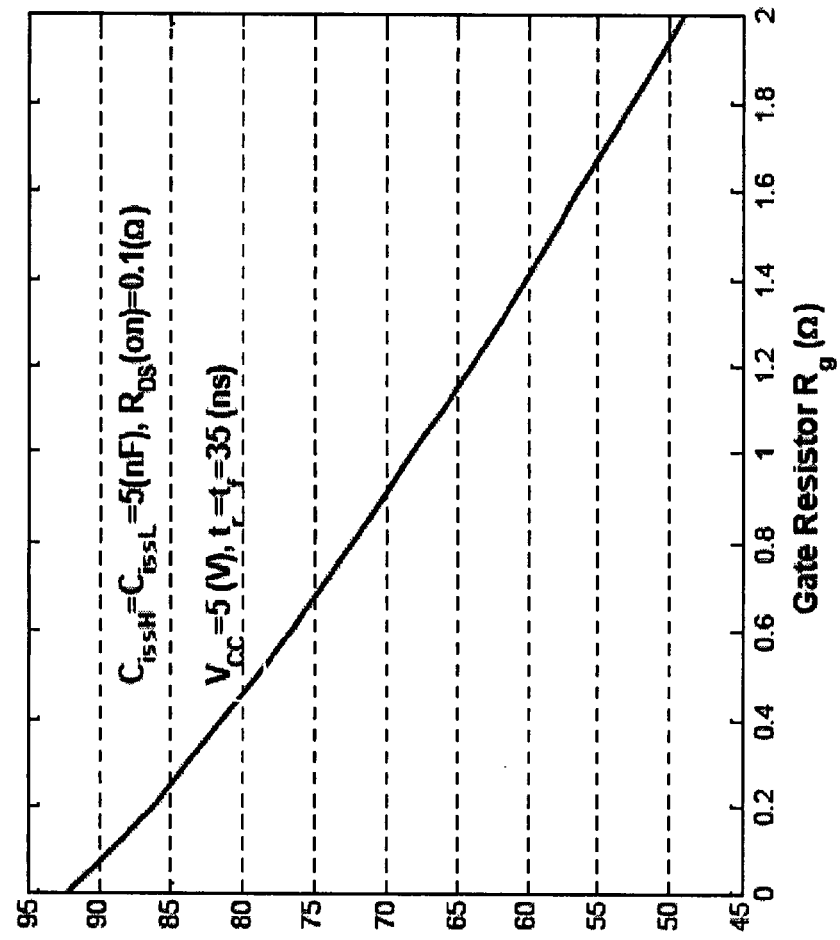
FIG. 8 is an example diagram illustrating a percentage of savings in driving losses of a switch driver circuit according to embodiments herein compared to a conventional switch driver circuit.

FIG. 8 is an example diagram illustrating the percentage savings in driving losses of the proposed resonant gate driver as compared to losses in conventional gate driver circuits. The rise/fall time is about 35 ns. Larger gate resistor values result in more driving losses at the same rise/fall time. In order to reduce driving losses, one embodiment herein includes utilizing power field effect transistors with small gate resistor values.

Example Simulation Results

To verify the performance of an example embodiment of switch driver circuit 150, simulations run in PSPICE. SPICE model IRLMS 1902 from International Rectifier Co. was chosen for the small driving switches (M1, M2, M3, and M4). The voltage source was set to 5 volts. The gate resistor Rg is assumed to be 1Ω, and CissH, CissL was assumed to be 5 nF (nanofarads). The resonant inductors (Lr1 and Lr2) are 1 uH (microhenry) and the coupling coefficient was set be 0.9, thus LM was set to is 0.9 uH. The switching frequency is 1 MHz (megahertz).

Figure 9:
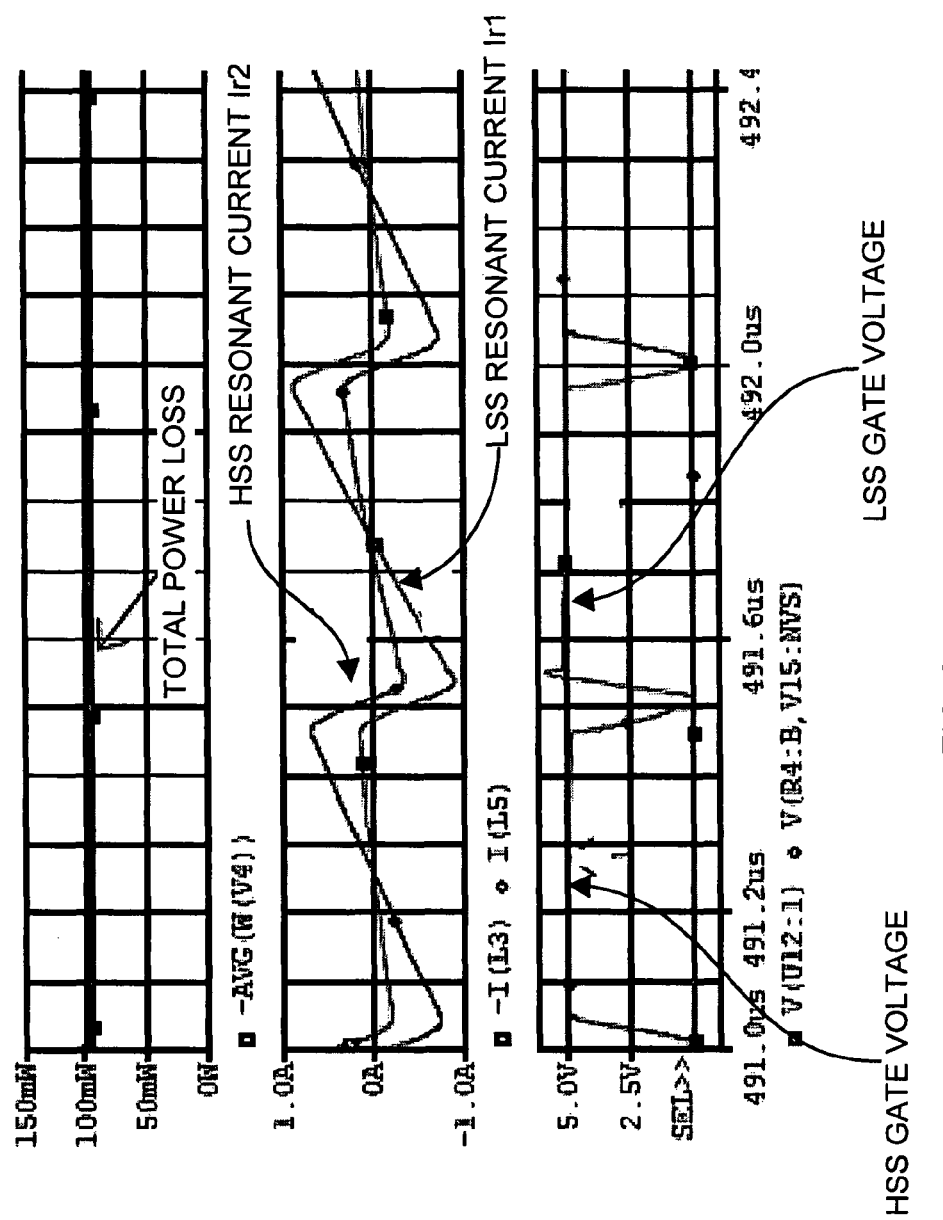
FIG. 9 is an example diagram of simulation results according to embodiments herein.

FIG. 9 is an example diagram illustrating simulation results associated with switch driver circuit 150 for the parameter settings as indicated above. The rise/fall time is about 35 ns (nanoseconds) and the power consumption is about 90 mW (milliwatts), which is a very small loss amount.

Note that techniques herein are well suited for use in switching applications. However, it should be noted that embodiments herein are not limited to use in such applications and that the techniques discussed herein are well suited for other applications as well.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

What is claimed is:

1. An apparatus comprising:
   a first switch device;
   a first driver circuit to drive the first switch device;
   a second switch device;
   a second driver circuit to drive the second switch device;
   the first switch device and the second switch device electrically coupled to each other and a node of an inductor through which current is delivered to a load, the first switch device and the second switch device activated at different times based on reuse of switch activation energy;
   a bridge circuit to transfer the switch activation energy between the first driver circuit and the second driver circuit, the first driver circuit and the second driver circuit utilizing the transferred switch activation energy to drive respective gates of the first switch device and the second switch device at the different times; and
   a controller to initiate reuse of the switch activation energy via the transfer of the switch activation energy between the first driver circuit and the second driver circuit, the controller initiating a transfer of the switch activation energy between the first driver circuit and the second driver circuit depending on a magnitude of an output voltage applied to the load, the controller utilizing the switch activation energy to activate the first switch device while the second switch device is deactivated, the controller initiating a transfer of the switch activation energy previously used to activate the first switch device from the first driver circuit through the bridge circuit to the second driver circuit to activate the second switch device while the first switch device is deactivated.

2. An apparatus as in claim 1, wherein the first switch device is a first field effect transistor and the second switch device is a second field effect transistor; and
 wherein the switch activation energy is initially used to activate the first field effect transistor and, subsequent to a transfer of the switch activation energy by the bridge circuit from the first driver circuit to the second driver circuit, activate the second field effect transistor.

3. An apparatus as in claim 1, wherein the switch activation energy is an electrical charge circulated between a respective gate of the first switch device and a respective gate of the second switch device via a combination of circuitry including the first driver circuit, the second driver circuit, and the bridge circuit.

4. An apparatus as in claim 3, wherein the controller activates the first switch device and deactivates the second switch device when a monitored output voltage produced by the inductor is above a first threshold value, the output voltage used to power the load; and
 wherein the controller deactivates the first switch device and activates the second switch device when the monitored output voltage is below a second threshold value.

5. An apparatus as in claim 1, wherein the first switch device is a high side switch of a DC-DC power converter and the second switch device is a low side switch of a DC-DC power converter, the apparatus further comprising:
 the controller controlling a state of the first switch device and the second switch device based on an output voltage produced by the DC-DC power converter circuit.

6. An apparatus as in claim 5, wherein the bridge circuit at least partially provides coupling of a respective gate of the first switch device to a respective gate of the second switch device enabling the transfer of the switch activation energy between the first switch device and the second switch device.

7. An apparatus as in claim 1, wherein the bridge circuit includes multiple inductors having a common magnetic core.

8. An apparatus as in claim 7, wherein the bridge circuit includes a capacitor coupling the multiple inductors.

9. An apparatus comprising:
 a first switch device;
 a first driver circuit to drive the first switch device;
 a second switch device;
 a second driver circuit to drive the second switch device;
 the first switch device and the second switch device electrically coupled to each other and a node of an inductor through which current is delivered to a load, the first switch device and the second switch device activated at different times based on reuse of switch activation energy; and
 a bridge circuit to transfer the switch activation energy between the first driver circuit and the second driver circuit, the first driver circuit and the second driver circuit utilizing the transferred switch activation energy to drive respective gates of the first switch device and the second switch device at the different times; and
 wherein the bridge circuit includes an inductor in series with a capacitor, a combination of which couples the first driver circuit to the second driver circuit to transfer of the switch activation energy between the first switch device and the second switch device.

10. An apparatus comprising:
 a first switch device;
 a first driver circuit to drive the first switch device;
 a second switch device;
 a second driver circuit to drive the second switch device;
 the first switch device and the second switch device electrically coupled to each other and a node of an inductor through which current is delivered to a load, the first switch device and the second switch device activated at different times based on reuse of switch activation energy;
 a bridge circuit to transfer the switch activation energy between the first driver circuit and the second driver circuit, the first driver circuit and the second driver circuit utilizing the transferred switch activation energy to drive respective gates of the first switch device and the second switch device at the different times; and
 wherein the bridge circuit includes a resonant circuit coupling the first driver circuit and the second driver circuit, the resonant circuit supporting transfer of a charge between the first switch device and the second switch device to switch between activating the first switch device and the second switch device via reuse of the charge.

11. An apparatus as in claim 10, wherein the resonant circuit provides at least part of a circuit path from a respective gate of the first switch device and a respective gate of the second switch device to transfer the charge between the first switch device and the second switch device.

12. An apparatus as in claim 10 further comprising:
 a controller to control the transfer of the charge through the resonant circuit between the first switch device and the second switch device.

13. A method comprising:
 activating a first switch device by initiating application of charge to a respective gate of the first switch device, activation of the first switch device turning the first switch device to an ON state during which the first switch device conveys current from a first voltage source through an inductor to a load;
 initiating a transfer of the charge from the respective gate of the first switch device to a respective gate of the second switch device, application of the charge to the respective gate of the second switch device causing the second switch device to switch to an ON state during which the second switch device conveys current from a second voltage source through the inductor to the load;
 reusing the charge via the transfer of the charge between the first switch device and the second switch device;
 initiating a transfer of the charge between the first switch device and the second switch device depending on a magnitude of an output voltage applied to the load, the output voltage produced from the current through the inductor;
 utilizing the charge to activate the first switch device while the second switch device is deactivated; and
 initiating a transfer of the charge previously used to activate the first switch device from a first driver circuit through a bridge circuit to a second driver circuit that applies the charge to the second switch device to activate the second switch device while the first switch device is deactivated.

14. A method as in claim 13, wherein initiating the transfer of the charge from the respective gate of the first switch device to a respective gate of the second switch device results in deactivation of the first switch device followed by activation of the second switch device to the ON state.

15. A method as in claim 13, wherein activating the first switch device occurs in response to detecting that a voltage output of a respective power converter device used to power the load falls below a threshold value; and wherein activating the second switch device occurs in response to detecting that the voltage output of the power converter device increases to a voltage level above the threshold value.

16. A method as in claim 13 further comprising:
repeatedly initiating a transfer of the charge between the first switch device and the second switch device to control a respective output voltage of a power converter circuit within a voltage range.

17. A method as in claim 13 further comprising:
via driver circuits controlling application of the charge to the first switch device and the second switch device, varying an amount of time that the charge is applied to the respective gate of the first switch device and subsequently applied to the respective gate of the second switch device to produce a substantially constant output voltage of a power converter circuit.

18. The apparatus as in claim 1, wherein the first switch device is a first field effect transistor and the second switch device is a second field effect transistor; and
wherein the first driver circuit applies the switch activation energy to a respective gate of the first field effect transistor to activate the first field effect transistor while the second field effect transistor is deactivated, and
wherein the second driver circuit applies the switch activation energy to a respective gate of the second field effect transistor to activate the second field effect transistor while the first field effect transistor is deactivated.

19. An apparatus comprising:
a first switch device;
a first driver circuit to drive the first switch device;
a second switch device;
a second driver circuit to drive the second switch device;
the first switch device and the second switch device electrically coupled to each other and a node of an inductor through which current is delivered to a load, the first switch device and the second switch device activated at a different times based on reuse of switch activation energy; and
a bridge circuit to transfer the switch activation energy between the first driver circuit and the second driver circuit, the first driver circuit and the second driver circuit utilizing the transferred switch activation energy to drive respective gates of the first switch device and the second switch device at the different times;
wherein the first switch device is a first field effect transistor and the second switch device is a second field effect transistor, and
wherein the first driver circuit applies the switch activation energy to a respective gates of the first field effect transistor to activate the first field effect transistor while the second field effect transistor is deactivated, and
wherein the second driver circuit applies the witch activation energy to a respective gate of the second field effect transistor to activate the second field effect transistor while the first field effect transistor is deactivated;
wherein the first driver circuit transfers switch activation energy previously applied to the respective gate of the second field effect transistor to the respective gate of the first field effect transistor; and
wherein the second driver circuit transfers switch activation energy previously applied to the respective gate of the first field effect transistor to the respective gate of the second field effect transistor.

20. An apparatus as in claim 19, wherein the first field effect transistor is a high side switch of a DC-DC power converter and the second field effect transistor is a low side switch of a DC-DC power converter, both the first field effect transistor and the second field effect transistor coupled to the node of the inductor, the apparatus further comprising:
a controller to control a state of the first field effect transistor and the second field effect transistor based on an output voltage produced by the DC-DC power converter circuit.

21. An apparatus as in claim 20, wherein the controller prevents cross-conduction by implementing a delay between a time of activating the first field effect transistor and a subsequent time of activating the second field effect transistor.

22. An apparatus as in claim 21, wherein the bridge circuit includes at least one inductive path on which to transfer the switch activation energy between the first field effect transistor and the second field effect transistor.

23. An apparatus as in claim 22, wherein the at least one inductive path includes a resonant inductor circuit to repeatedly circulate the switch activation energy between the respective gate of the first field effect transistor and the respective gate of the second field effect transistor.

24. The apparatus as in claim 1, wherein the
controller is in communication with the first driver circuit and the second driver circuit, the controller monitoring an output voltage of the inductor that is used to power the load, the controller producing control signals to control a transfer of the switch activation energy through the bridge circuit between the first driver circuit and the second driver circuit based at least in part on a magnitude of the output voltage.

25. The apparatus as in claim 24, wherein the bridge circuit is a resonant circuit initiating the transfer of the switch activation energy between the first driver circuit and the second driver circuit in accordance with states of the control signals produced by the controller.

26. The apparatus as in claim 25, wherein the bridge circuit includes two parallel half bridge rectifier circuits.

27. The apparatus as in claim 26, wherein the inductor is part of a phase of a synchronous buck converter.

* * * * *